United States Patent
Gough et al.

(10) Patent No.: US 8,175,261 B2
(45) Date of Patent: May 8, 2012

(54) SYSTEMS AND METHODS FOR ADAPTIVE ECHO CANCELLATION

(75) Inventors: Andrew Gough, London (GB); David Brown, Abbotslley (GB)

(73) Assignee: Maxim Integrated Products, Inc., Sunnyvale, CA (US)

( * ) Notice: Subject to any disclaimer, the term of this patent is extended or adjusted under 35 U.S.C. 154(b) by 996 days.

(21) Appl. No.: 11/917,764

(22) PCT Filed: Jun. 16, 2006

(86) PCT No.: PCT/GB2006/002220
§ 371 (c)(1),
(2), (4) Date: Jun. 16, 2008

(87) PCT Pub. No.: WO2006/134387
PCT Pub. Date: Dec. 21, 2006

(65) Prior Publication Data
US 2009/0116638 A1   May 7, 2009

(30) Foreign Application Priority Data
Jun. 16, 2005  (GB) .................................. 0512300.5

(51) Int. Cl.
*H04M 9/08* (2006.01)
(52) U.S. Cl. ................................ 379/406.08; 381/71.11
(58) Field of Classification Search ............. 379/3, 406.01–406.16; 381/71.11, 381/71.12
See application file for complete search history.

(56) References Cited

U.S. PATENT DOCUMENTS

| | | | | |
|---|---|---|---|---|
| 6,185,300 B1* | 2/2001 | Romesburg | ............. | 379/406.09 |
| 6,219,418 B1* | 4/2001 | Eriksson et al. | ......... | 379/406.08 |
| 6,442,275 B1* | 8/2002 | Diethorn | .................. | 379/406.14 |
| 6,771,772 B1* | 8/2004 | Tanrikulu | ................. | 379/406.14 |
| 2002/0114445 A1* | 8/2002 | Benesty et al. | .......... | 379/406.01 |
| 2005/0147230 A1* | 7/2005 | Bershad et al. | .......... | 379/390.02 |

FOREIGN PATENT DOCUMENTS

GB       2427332 B  *  5/2007

* cited by examiner

Primary Examiner — M D S Elahee
Assistant Examiner — Akelaw Teshale
(74) Attorney, Agent, or Firm — North Weber & Baugh LLP

(57) ABSTRACT

An echo canceller comprises foreground and background filters. The background filter locates and confirms peaks, defines active regions centered about the confirmed peaks and updates coefficients of the foreground filter when the background filter is more effective than the foreground filter. A method for improved adaptive echo cancellation comprises configuring a foreground filter, calculating an echo-return loss responsive to the foreground filter, identifying the location of one or more peaks repetitively in a block of data in a background filter, confirming one or more identified peaks over a defined number of blocks before defining an active region equally about the identified peaks in the background filter, filtering the sparse impulse response responsive to the active regions, calculating an echo-return loss responsive to the background filter, and updating the foreground filter when the background filter includes a more effective set of filter coefficients.

20 Claims, 11 Drawing Sheets

BACKGROUND FILTER - MODE 1 OPERATION
SUB-BAND MULTIPLE PEAK IDENTIFICATION

BACKGROUND FILTER - MODE 2 OPERATION
CONFIRMATION OF MULTIPLE ACTIVE REGIONS

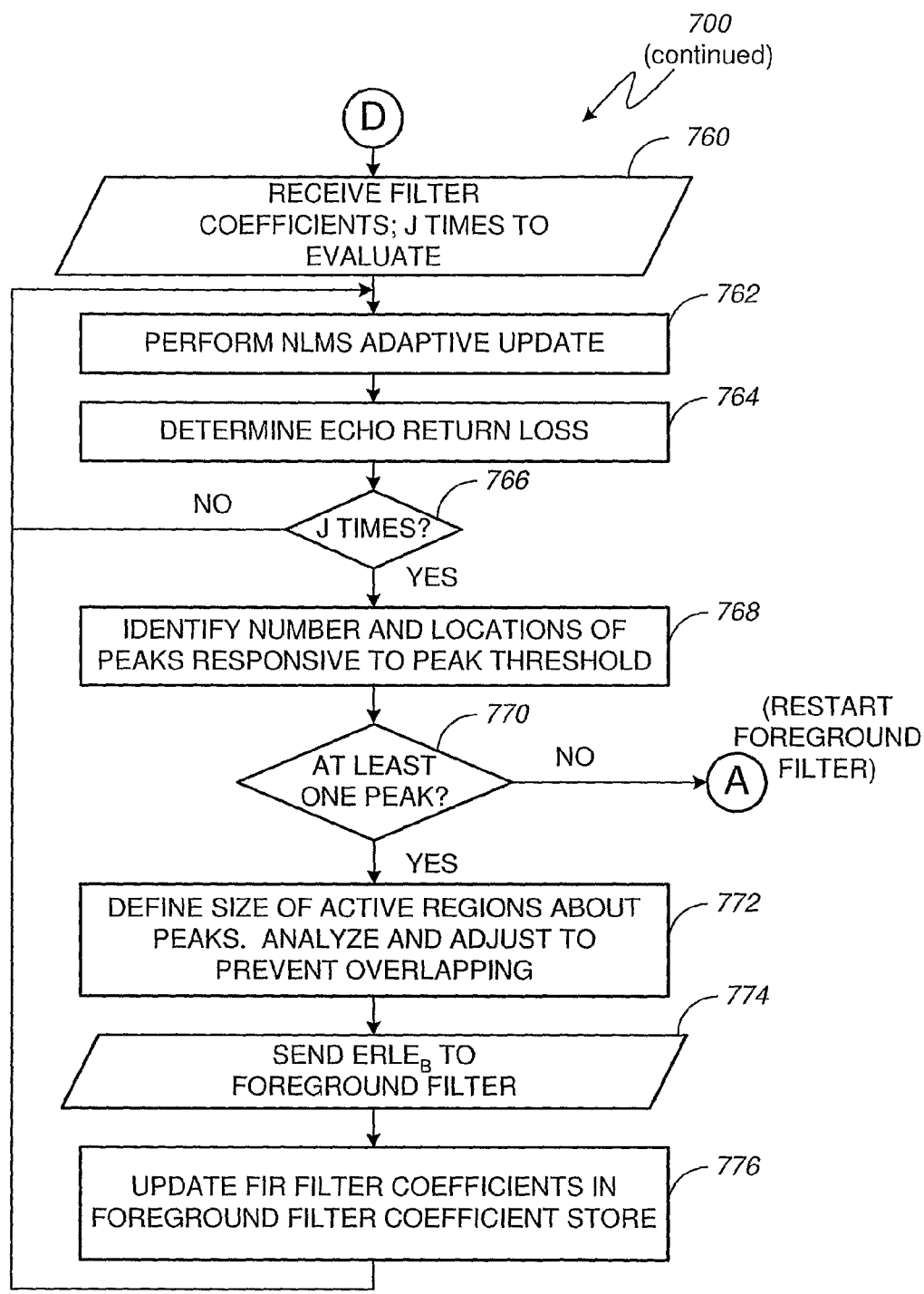
FIG. 7D — BACKGROUND FILTER - MODE 3 OPERATION ADAPTIVE UPDATE OF MULTIPLE ACTIVE REGIONS

SYSTEMS AND METHODS FOR ADAPTIVE ECHO CANCELLATION

BACKGROUND

Telecommunication system subscribers use speech quality as a benchmark for assessing the overall quality of a network. Regardless of whether perceived speech quality is a subjective judgment, it is one key to retaining subscriber loyalty. For this reason, the removal of hybrid and acoustic echo inherent within telecommunication systems is important for improving perceived voice quality.

The first echo suppression devices were introduced in the 1950s. These systems, used to manage echo generated in satellite-based systems, were essentially voice-activated switches that transmitted a voice path and then were turned off to block any echo signal. Although echo suppressors reduced echo caused by transmission problems in the network, they also resulted in choppy first syllables and artificial volume adjustment. In addition, they eliminated double-talk capabilities, greatly reducing the ability to achieve natural conversations.

Echo cancellation theory was developed in the early 1960s by AT&T Bell Labs followed by the introduction of the first echo-cancellation system in the late 1960s by Communications Satellite (COMSAT) TeleSystems (previously a division of COMSAT Laboratories, hereafter COMSAT). COMSAT designed the first analog echo-canceller systems to demonstrate the feasibility and performance of satellite communications networks. These early echo-cancellation systems were implemented across satellite communication networks to demonstrate the network's performance for long-distance telephony. These systems were not commercially viable because of their size and manufacturing costs.

In the late 1970s, COMSAT developed and sold the first commercial analog-echo cancellers, which were mainly digital devices with an analog interface with the network. The semiconductor revolution of the early 1980s marked the switch from analog to digital communications networks. Soon, multi-channel echo-cancellers with digital interfaces were developed to address new echo problems associated with long-distance digital telephony systems. Based on application-specific integrated circuit (ASIC) technology, these new echo cancellers used high-speed digital signal processing techniques to model and subtract the echo from the echo return path.

Explosive growth in digital and wireless networks have brought to market new analog and digital wireless handsets, numerous service carriers, and new digital network communication protocols such as time division multiple access (TDMA), code division multiple access (CDMA), the global system for mobile communications (GSM), voice over Internet protocol (VOIP), etc. Understanding and overcoming inherent echo problems associated with digital networks will enable telecommunication service providers to achieve superior voice transmission quality that service subscribers expect.

Acoustic echo is generated with analog and digital handsets. This form of echo is produced by poor voice coupling between the earpiece and the microphone in handsets and hands-free devices. Further voice degradation is caused as voice-compressing encoding/decoding devices (vocoders) process the voice paths within the handsets and in wireless networks. This results in returned echo signals with highly variable properties. When compounded with inherent digital transmission delays call quality is greatly diminished.

Hybrid echo is the primary source of echo generated in the public-switched telephone network (PSTN). This electrically generated echo is created as voice signals are transmitted across the network via the hybrid connection at the two-wire/four-wire PSTN conversion points, reflecting electrical energy back to the speaker from the four-wire circuit. Although not a factor in pure digital cellular networks, hybrid echo is problematic in calls that traverse the PSTN. The hybrid is by its nature a leaky device. As voice signals pass from the four-wire to the two-wire portion of the network, the energy in the four-wire section is reflected back on itself, creating the echoed speech. Provided that the round-trip delay occurs within a few milliseconds (i.e., within approximately 28 ms), it generates a sense that the call is live by adding side tones, which contributes positively to the quality of the call.

In cases where the total network delay exceeds approximately 36 ms, however, the positive benefits disappear and intrusive echo results. The amount of signal that is reflected back depends on how well the hybrid matches the two-wire line. In the vast majority of cases, the match is poor, resulting in a considerable level of reflected signal.

Digital processing delays and speech-compression techniques further contribute to degraded voice quality in digital networks. Delays are encountered as signals are processed through various routes using different media within the networks, including copper wire, fiber optic lines, microwave links, international gateways, and satellite signal transmissions. This is especially true with mixed technology networks, where calls are processed across numerous network infrastructures.

Therefore, further improvements to systems and methods for echo cancellation are desired.

SUMMARY

One embodiment of an adaptive echo canceller comprises a foreground filter and a background filter. The foreground filter is configured to remove echo-induced peaks in a sparse impulse response. The foreground filter is applied to an input signal to cancel the echo-induced peaks and a foreground echo-return loss value is determined. The background filter bandpass filters and decimates the sparse impulse response, repetitively identifies the location of one or more peaks in the sparse impulse response, and confirms one or more peaks over a defined number of samples before defining an active region equally about the one or more identified peaks. An adaptive update of a finite impulse response filter is performed over the identified active regions. Thereafter, a background echo-return loss value responsive to the background filtered sparse impulse response is calculated. Foreground filter finite impulse response filter coefficients are updated with coefficients from the background filter when at least one peak is confirmed and the background echo-return loss exceeds the foreground echo-return loss.

Another embodiment describes a method for adaptive echo cancellation. The method comprises applying an input signal to a foreground filter to generate a filtered signal, determining an echo return loss responsive to the foreground filter, configuring an adaptive background filter that performs a normalized least-mean square update responsive to a block of data representing the input signal, repetitively identifying the location of a peak in the input signal, confirming one or more identified peaks over a defined number of samples of the input signal before defining an active region equally about the identified peaks, modifying the background filter responsive to the active regions, applying the background filter to the input signal, determining an echo return loss responsive to the background filter, wherein when a peak is confirmed and when the echo return loss responsive to the background filter exceeds the echo return loss responsive to the foreground filter, coefficients from the foreground filter are replaced by coefficients from the background filter to generate a modified foreground filter, which is then applied to cancel echo in the input signal.

BRIEF DESCRIPTION OF THE DRAWINGS

The present systems and methods for adaptive echo cancellation, as defined in the claims, can be better understood with reference to the following drawings. The components within the drawings are not necessarily to scale relative to each other, emphasis instead is placed upon clearly illustrating the principles for adaptive echo cancellation.

FIGS. 7A-7E are flow diagrams illustrating portions of an embodiment of a method for adaptive echo cancellation.

DETAILED DESCRIPTION

Figure 1:
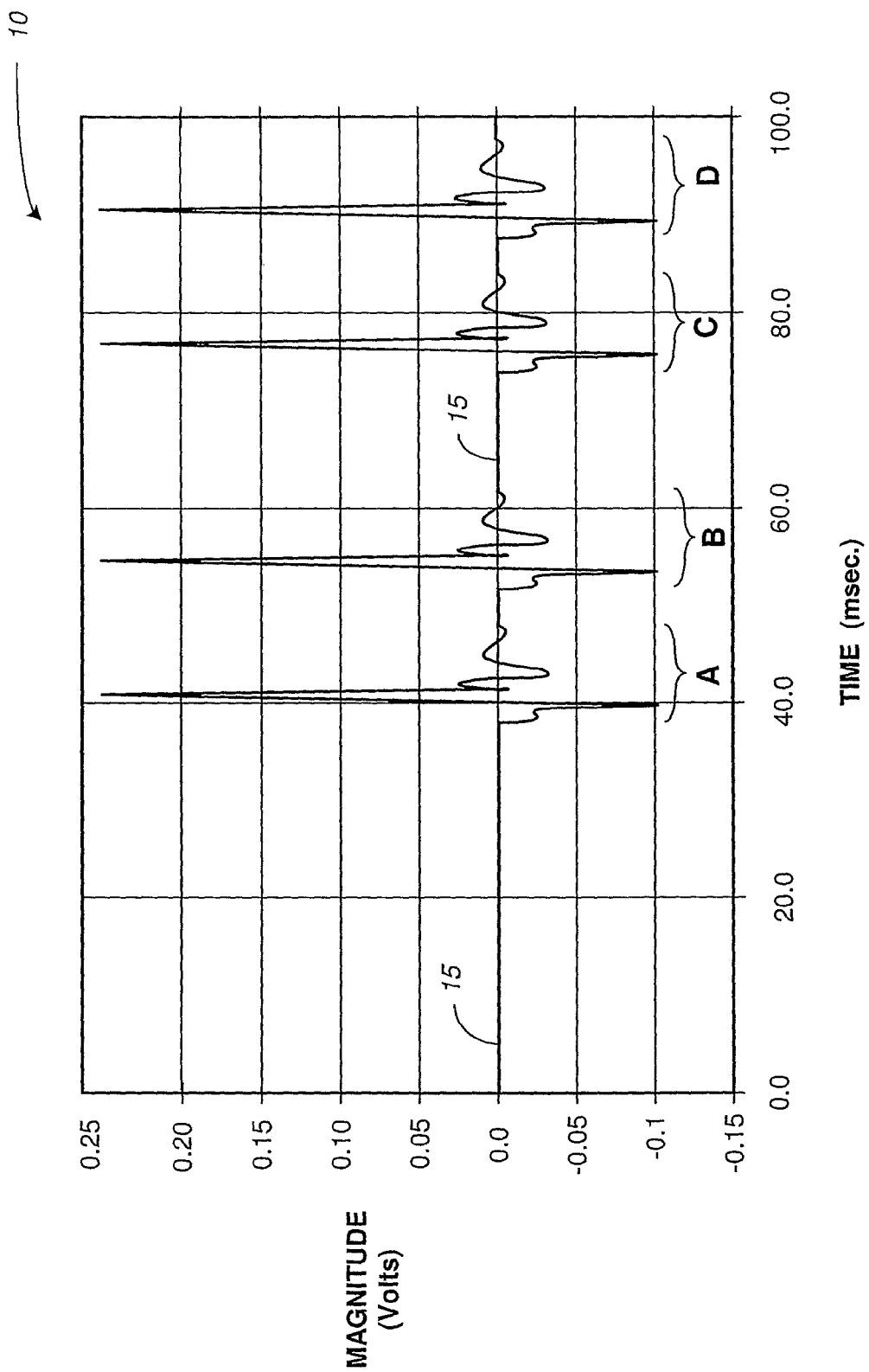
FIG. 1 is a plot illustrating an example sparse impulse response with multiple time periods where the response includes undesired activity.

The systems and methods for adaptive echo cancellation described below remove unknown multiple echoes from a sparse impulse response in packet-switched networks. Although intended for packet-switched communication networks, the described echo canceller and adaptive echo cancellation techniques are suited to other communication systems with signal paths that include undesired hybrid induced or acoustic echoes.

The echo canceller applies a foreground filter to a digital representation of a sparse impulse response in a communication system. The foreground filter includes a finite-impulse response (FIR) filter. In an adaptive mode, a normalized least mean square (NLMS) update algorithm is used to modify the FIR filter coefficients. In a fixed mode, the foreground filter uses coefficients provided by a background filter. Structurally, FIR filters consist of just two things: a sample delay line and a set of coefficients. To implement the filter, an input sample is introduced into the delay line, each sample in the delay line is multiplied by a corresponding coefficient and the results are accumulated. Thereafter, the delay line is shifted one sample to make room for the next input sample. Echo cancellation is not a perfect process. The best the FIR filter of the foreground filter can do is attenuate the level of the returning echo. An echo-return loss enhancement (ERLE) is a measure of the echo attenuation that results from application of the FIR filter in the signal path. ERLE is the difference between the echo level arriving from a tail circuit, i.e., the analog circuit that terminates the voice call from the perspective of the communicating party experiencing the echo, and the level of the signal leaving the echo canceller.

In addition to the foreground filter, the echo canceller applies a multiple-mode or multiple-stage background filter. In a first operating mode, possible positions of active regions in the impulse response are estimated. In a second operating mode, an adaptive echo-cancelling algorithm is applied to the possible active regions to verify multiple active regions in the sparse impulse response. In a third operating mode an adaptive echo-cancelling algorithm is applied to only the defined active regions, thereby minimizing computational complexity.

The background filter employs a sub-band filter and decimates the sparse impulse response data. The filtered and decimated data is applied to an improved proportionate normalized least mean square (IPNLMS) algorithm. The IPNLMS algorithm is modified to encourage the development of multiple peaks in the impulse response. The modification comprises dividing an adaptation gain matrix into partitions. Dividing the adaptation gain matrix into multiple partitions increases the rate of development of filter coefficients.

Peak detection is achieved by employing a time averaging method on the index of the maximum absolute coefficient. Once one or more peaks have been located, a NLMS algorithm is used in a standard adaptive update manner to confirm the number and location of one or more peaks in the sparse impulse response. If at least one peak is confirmed, the effectiveness of the background filter at removing echoes from the sparse impulse response is compared with the effectiveness of the foreground filter. When the effectiveness of the background filter exceeds that of the foreground filter, the foreground filter is updated with the coefficients from the background filter.

The background filter has the ability to track small movements of echoes and repositions active region windows accordingly. An active region is that portion of time that the NLMS adaptive algorithm is operating upon the peak. In the case of multiple peaks, the background filter applies multiple active regions. An active region adjuster ensures that the active regions are centered about identified peaks and that adjacent active regions do not overlap.

Reference will now be made in detail to the description of example embodiments of the systems and methods for adaptive echo cancellation as illustrated in the drawings. Reference is made to FIG. 1, which includes a plot 10 illustrating an example sparse impulse response with multiple time periods where the response includes undesired echoes. Plot 10 depicts time in milliseconds from left to right and magnitude in volts from bottom to top in FIG. 1. Trace 15 represents an example sparse impulse response. Trace 15 includes four distinct periods, labeled A through D where magnitude of sparse impulse response indicates an echo-induced region of activity in the example sparse impulse response. A first period, labeled "A," extends from approximately 38 ms after time 0 to approximately 45 ms after time 0. A second period, labeled "B," extends from approximately 53 ms after time 0 to approximately 62 ms after time 0. A third period, labeled "C," extends from approximately 76 ms after time 0 to approximately 84 ms after time 0. A fourth period, labeled "B," extends from approximately 87 ms after time 0 to approximately 97 ms after time 0. In the absence of a sampled voice band signal, the peaks in periods A through D are indicative of undesired echoes induced by hybrids in the tail circuit or other mismatches along the equipment and media that form the signal path.

Figure 2:
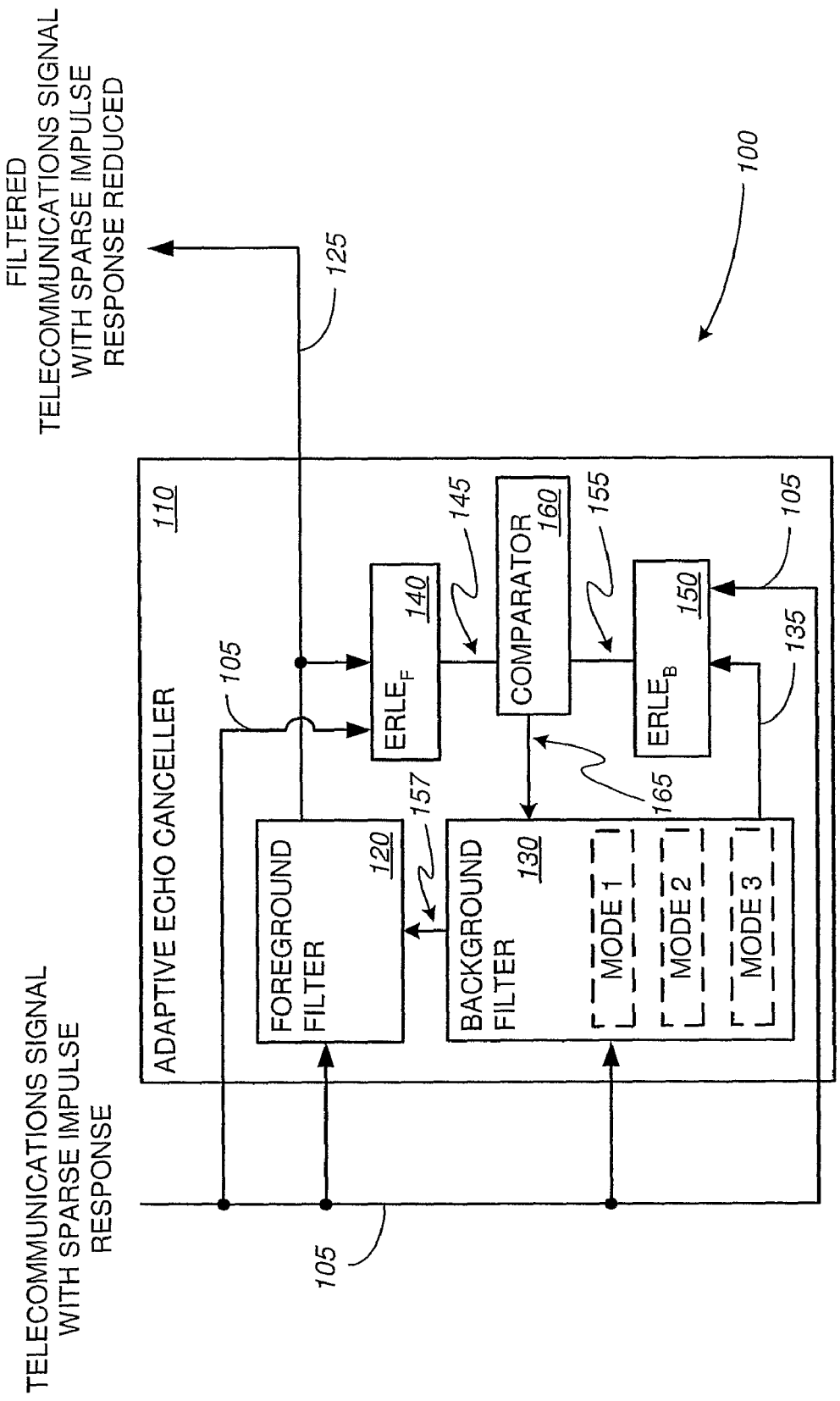
FIG. 2 is a functional block diagram illustrating an embodiment of an adaptive echo canceller.

FIG. 2 is a functional block diagram illustrating an embodiment of an adaptive echo canceller that is introduced into a telecommunications system signal path to reduce the magnitude of the sparse impulse response over one or more of the periods A through D introduced in FIG. 1. Telecommunications system 100 includes adaptive echo canceller 110 disposed along signal path 105. Adaptive echo canceller 110 includes a foreground filter 120 and a background filter 130 that both receive digital data via signal path 105. Foreground filter 120 receives and filters the digital data and forwards a filtered signal along signal path 125. The effectiveness of the foreground filter 120 at removing the echoes is determined by echo return loss enhancement ($ERLE_F$) 140 which compares the unfiltered signal along path 105 with the output of the foreground filter along path 125. In two of three distinct operational modes (modes 2 and 3), background filter 130 receives and filters the digital data and forwards a filtered signal along path 135. In mode 1, background filter 130 identifies a user-defined number of peaks in the sparse impulse response. The effectiveness of the background filter 130 at removing the echoes in modes 2 and 3 is determined by echo return loss enhancement ($ERLE_B$) 150 which compares the unfiltered signal along path 105 with the output of the background filter along path 135. Compare logic 160 receives an indication of the effectiveness of foreground filter 120 along connection 145 and receives an indication of the effectiveness of background filter 130 along connection 155. When the effectiveness of background filter 130 exceeds the effectiveness of foreground filter 120 at reducing the echoes in the sparse impulse response, compare logic 160 directs the background filter 130 via connection 165 to forward background filter coefficients to the foreground filter 120 via connection 157. The foreground filter 120 alone is responsible for the filtered signal forwarded along signal path 125. The foreground filter 120 and background filter 130 continue to operate in this manner throughout the duration of a communication session.

Figure 3:
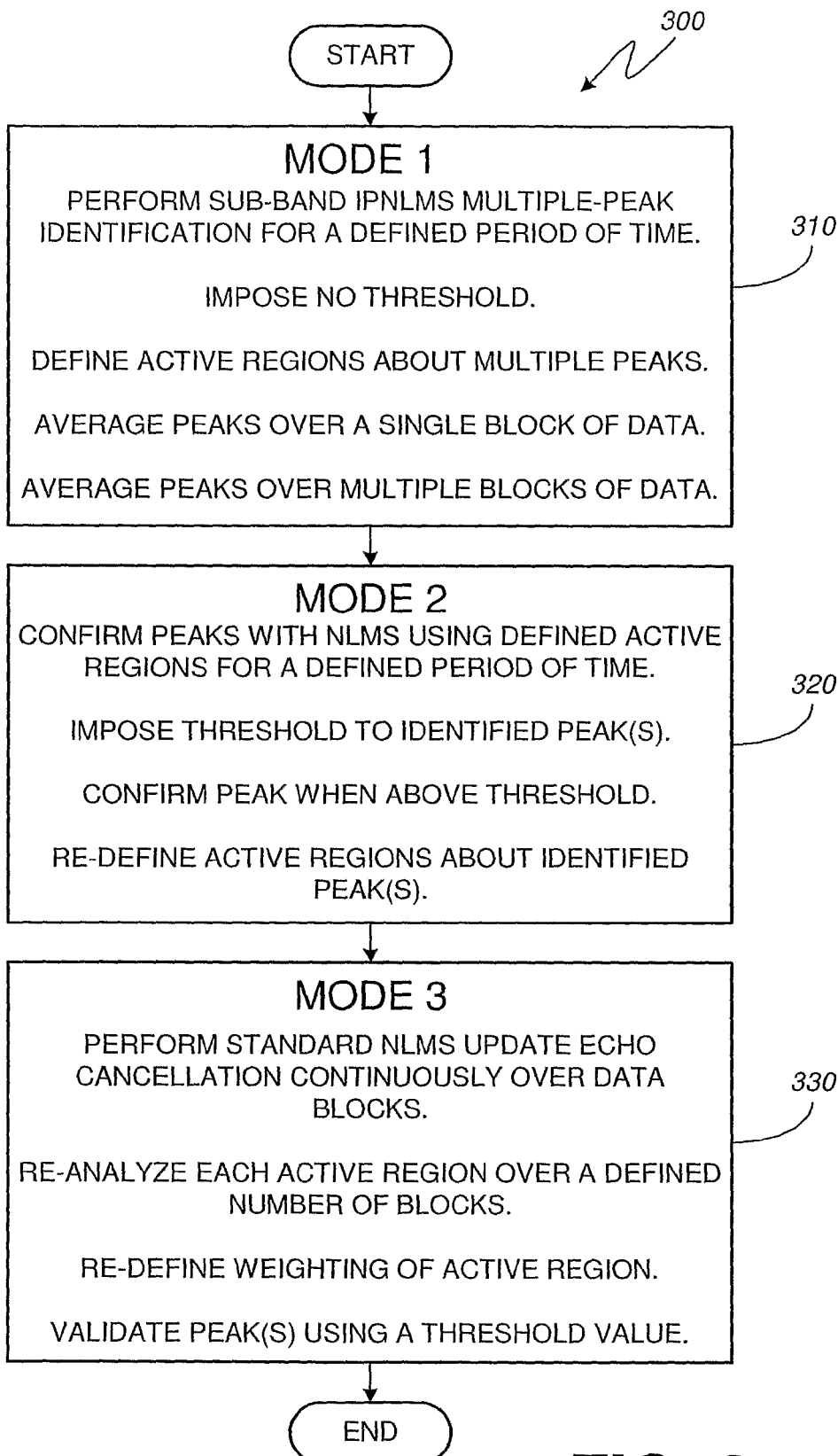
FIG. 3 is a flow diagram illustrating an overview of the operation of the background filter of the adaptive echo canceller of FIG. 2.

FIG. 3 is a flow diagram illustrating an overview of the operation of the background filter 130 of the adaptive echo canceller 110 of FIG. 2. Background filter process 300 begins with mode 1 in block 310. As indicated, mode 1 is configured to identify a user-defined number of peaks for a defined period of time. As described above, mode 1 processing is performed on a representation of the input signal that has been sub-band filtered and decimated. The filtered and decimated data signal is forwarded to a modified IPNLMS algorithm that identifies peaks in the data. No threshold is imposed during this mode 1 peak detection. In order to identify peaks in the data due to echoes, mode 1 is configured to average peaks over a single block of data before recording a result. Each result comprises a plurality of elements corresponding in number to a number of user-defined partitions (i.e., the number of echoes the background filter is instructed to identify). When background filter 130 is directed to identify 3 echo-induced peaks in the sparse impulse response, each result comprises 3 elements with each element corresponding to where a peak is located in the delay line. In addition to averaging each result over a single block of data, mode 1 is configured to average the results over multiple blocks of data by populating a matrix of results. The matrix of results is analyzed via a column analysis to generate a peak vector, which in the present example identifies the 3 most likely peaks in the response. Mode 1 processing continues by identifying the location of the identified peaks as a function of their respective occurrences in the peak vector over time. Thereafter, background filter 130 defines a period of time after time 0 or an active region where the impulse response shows activity about the peaks. Background filter 130 is further configured to analyze and adjust the defined active regions to prevent overlapping the identified active regions.

Once a user-defined period of time has elapsed, background filter 130 purges the coefficients identified by the IPNLMS algorithm and enters mode 2.

As indicated in block 320, mode 2 processing of background filter 130 is configured to confirm the peaks identified in mode 1 using a NLMS algorithm to adaptively filter data over a user defined amount of time. Mode 2 processing imposes a threshold. Peaks identified by the mode 2 NLMS algorithm that exceed the threshold value and that were previously identified during mode 1 operation are considered confirmed or true peaks due to echoes in the sparse impulse response. As further indicated in block 320, mode 2 processing includes the definition of active regions about the confirmed peaks and adjustment when necessary to prevent overlapping active regions. If at least one peak is confirmed during mode 2 processing and the background filter 130 is more effective than the foreground filter 120 at reducing undesired echoes from the input signal, background filter 130 transitions into operational mode 3. Otherwise, background filter 130 remains in mode 2.

As shown in block 330, mode 3 processing of background filter 130 is configured to perform a standard NLMS adaptive update on the coefficients generated during mode 2 operation over the input data. Mode 3 processing, like its predecessor mode 2, imposes a threshold when identifying peaks. Peaks identified by the mode 3 NLMS algorithm that exceed the threshold value are used to define active regions about the peaks. Mode 3 processing further includes adjustment of the active regions, when necessary, to prevent overlapping active regions. The effectiveness of the NLMS algorithm at removing undesired echoes from the impulse response is determined and compared with the effectiveness of the foreground filter 120 over the same data. When the background filter 130 is more effective than the foreground filter 120 at reducing the magnitude of undesired echoes in the sparse impulse response, the adaptive echo canceller 110 replaces the coefficients used in foreground filter 120 with the coefficients used in background filter 130. Thereafter, the adaptive echo canceller 110 continues to process input data for the duration of the communication session. In this way, the adaptive echo canceller 110 can react when the impulse response changes during the course of an active communication session. For example, an additional echo can be introduced if an additional handset is enabled at either end of the communication path. When such a condition occurs, the adaptive echo canceller 110 is well suited to quickly identify the location of the peak, confirm the peak, adaptively develop coefficients to reduce the undesired echo, and verify the effectiveness of the developed filter coefficients before adjusting the foreground filter 120.

Figure 4:
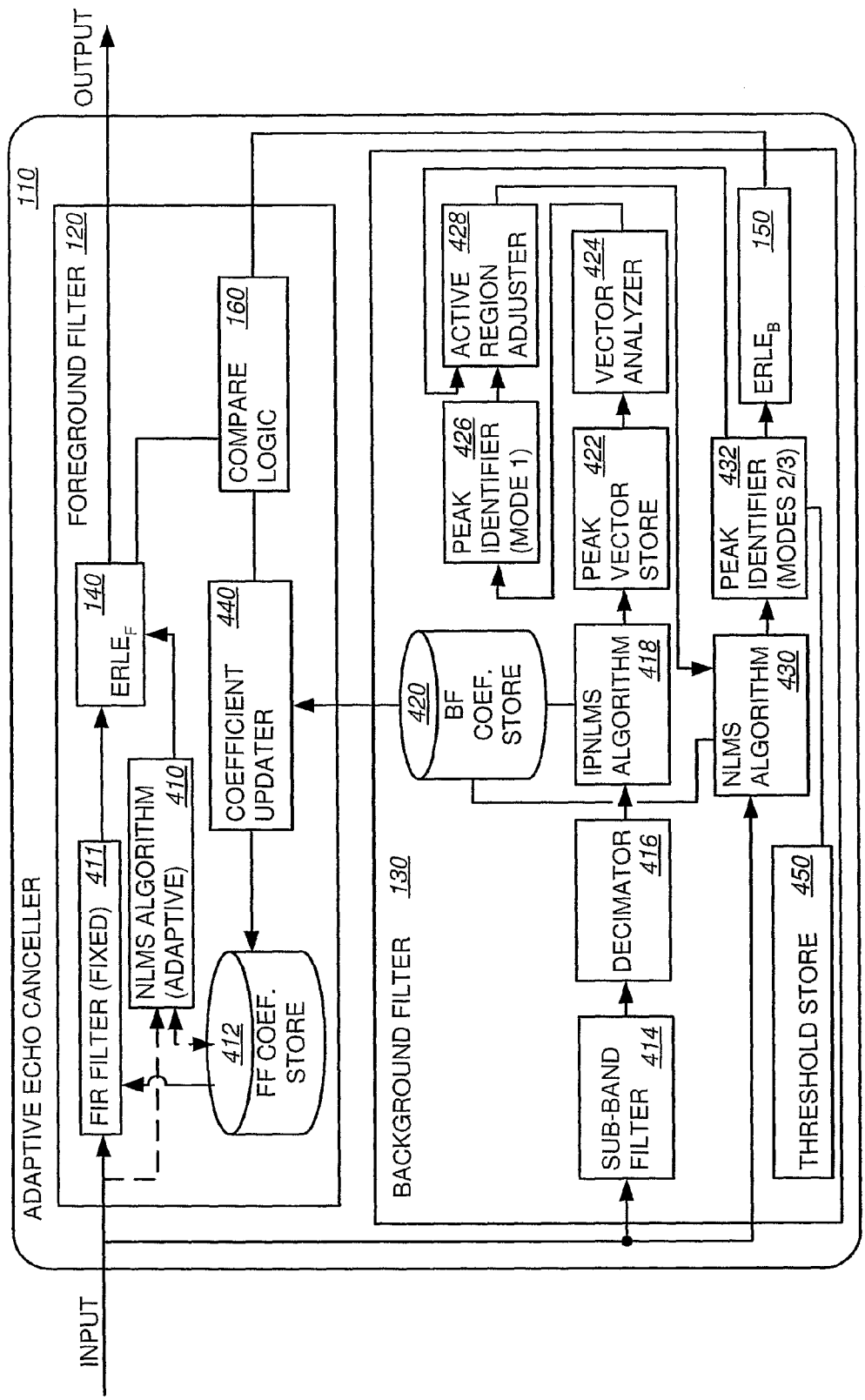
FIG. 4 is a functional block diagram illustrating an embodiment of the adaptive echo canceller of FIG. 2.

FIG. 4 is a functional block diagram illustrating an embodiment of the adaptive echo canceller 110 of FIG. 2. As illustrated in FIG. 4, the foreground filter 120 of the adaptive echo canceller 110 receives an input signal and generates an output signal. Unlike the foreground filter 120, the background filter 130 does not forward a filtered data signal to a destination outside the echo canceller.

Foreground filter 120 operates in one of two operational modes. In a first, adaptive operational mode, the input signal is applied to NLMS algorithm 410, which generates a coefficient vector for each input signal data sample. The NLMS algorithm 410 iteratively estimates a solution using a gradient descent method. This technique is used to compute new filter coefficients that minimize the distance between the computed output and the expected output. The NLMS algorithm 410 is performed in a loop so that with each new sample, a new coefficient vector is generated. Foreground filter coefficient store 412 can be initialized with a coefficient vector from a previous communication session, a coefficient vector expected to be effective for a wide range of actual conditions, or a zero vector among others. The NLMS algorithm 410 of the foreground filter 120 operates while background filter 130 operates in first and second background filter modes. In a second, fixed operational mode of the foreground filter 120, the input signal is applied to FIR filter 411 using the coefficients developed during background filter operational mode 3, which will be described below.

In both foreground filter operational modes, $ERLE_F$ 140 provides a measure of the effectiveness of the foreground filter 120 (i.e., NLMS algorithm 410 and FIR filter 411) in reducing undesired echoes from the input signal.

In background filter mode 1, NLMS algorithm 430, peak identifier 432, and $ERLE_B$ 150 are disabled. Background filter 130 receives the input signal at sub-band filter 414, which reduces signal components outside of the frequencies associated with telephonic communications. The sub-band filtered signal is decimated by decimator 416. Decimator 416 reduces the volume of data processed by background filter 130 and enables the IPNLMS algorithm 418 to quickly converge on one or more peaks in the input signal. The IPNLMS algorithm 418 filters the sampled and decimated input signal to identify peaks. Peak vector store 422 receives a vector representation of the input signal from the IPNLMS algorithm 418 and forms a vector array. The vector array elements indicate whether a peak was detected within a portion of the sparse impulse response. After multiple samples have been processed, vector analyzer 424 performs a columnar analysis of the elements in the vector array. If a peak is detected within a respective portion of the impulse response at a rate that exceeds a threshold rate, information regarding the peak is forwarded to peak identifier 426. Otherwise, the columnar data is ignored for that set of samples. Peak identifier 426 imposes no threshold on the magnitude of identified peaks. Peak identifier 426 forwards information concerning multiple possible peaks to active region adjuster 428. Active region adjuster 428 is configured to locate the peaks in time and determine an active region defined by a start and end point that encompass that portion of the sparse impulse response that includes undesired echo energy. Active region adjuster 428 also ensures that the defined active regions do not overlap in time.

In background filter mode 2, sub-band filter 414, decimator 416, IPNLMS algorithm 418, peak vector store 422, vector analyzer 424 and peak identifier 426 are disabled. The background filter coefficients developed by IPNLMS algorithm 418 are discarded by clearing the background filter coefficient store 420. Information regarding the one or more active regions identified during mode 1 background filter operation are stored in active region adjuster 428. Background filter 130 receives the input signal at NLMS algorithm 430. NLMS algorithm 430 provides an adaptive solution that converges on one or more peaks in the input signal. After multiple samples of input data have been processed by NLMS algorithm 430, peak identifier 432 analyzes one or more peaks in the filtered data by comparing the magnitude of the data at a possible peak with a threshold from threshold store 450. If a peak is below the threshold level, the peak is deemed inconsequential and the active region adjuster 428 will remove the active region. When an active region is removed, the adaptive taps allocated to that region are reallocated across the remaining active regions. Thereafter, active region adjuster 428 locates peaks in the response using the remaining filter coefficients and determines an active region defined by a start point and an end point that encompass that portion of the sparse impulse response that includes undesired echo energy responsive to peaks identified in mode 2. Active region adjuster 428 further ensures that the defined active regions do not overlap in time. $ERLE_B$ 150 then determines the effectiveness of the background filter 130 at reducing undesired echoes from the input signal. When background filter mode 2 operation fails to confirm a peak, the background filter 130 returns to mode 1. When background filter mode 2 operation confirms a peak and the background filter 130 is not more effective than the foreground filter 120 at reducing undesired peaks in the input signal, the background filter 130 remains in mode 2. Otherwise, when mode 2 operation of the background filter confirms one or more peaks and it is determined by compare logic 160 that the background filter 130 is more effective than the foreground filter 120 at reducing undesired peaks in the input signal, the background filter transitions to mode 3.

In background filter mode 3, sub-band filter 414, decimator 416, IPNLMS algorithm 418, peak vector store 422, vector analyzer 424 and peak identifier 426 are disabled. The background filter coefficients developed by NLMS algorithm 430 are retained and reused. Background filter 130 receives the input signal at NLMS algorithm 430. NLMS algorithm 430 provides an adaptive solution that converges on one or more peaks in the input signal. After multiple blocks of input data have been processed by NLMS algorithm 430, peak identifier 432 analyzes one or more peaks in the filtered data by comparing the magnitude of the data at a possible peak with a threshold from threshold store 450. If a peak is below the threshold level, the peak is deemed inconsequential and the active region adjuster 428 will remove the active region. When an active region is removed, the adaptive taps allocated to that region are reallocated across the remaining active regions. Thereafter, active region adjuster 428 locates peaks and determines an active region defined by a start point and an end point that encompass that portion of the sparse impulse response that includes undesired echo energy responsive to peaks identified in mode 3. Active region adjuster 428 checks to see whether the source of the echo has shifted a small amount by locating the maximum absolute value in the coefficients. The active region is then shifted about the newly identified peak. Active region adjuster 428 further ensures that the defined active regions do not overlap in time.

After the background filter 130 has operated in mode 3 for a sufficient amount of time, $ERLE_B$ 150 determines the effectiveness of the background filter 130 at reducing undesired echoes from the input signal. $ERLE_F$ 140 is enabled either prior to or substantially concurrently with mode 2 and mode 3 operation of the background filter 130. $ERLE_F$ 140 determines the effectiveness of the foreground filter 120 at reducing undesired echoes in the input signal. Compare logic 160 is enabled to compare the effectiveness measures associated with the respective filters. When the effectiveness of background filter 130 exceeds the effectiveness of foreground filter 120 at reducing the echoes in the sparse impulse response, compare logic 160 directs coefficient updater 440 to replace the coefficients in foreground filter coefficient store 412 with coefficients from the background filter coefficient store 420. Thereafter, foreground filter 120 continues to filter input signal for the duration of the communication session. Simultaneously, background filter 130 continues to operate in mode 3 looking for shifts in one or more undesired echoes over time. Thus, the background filter 130 continues to adapt and update the foreground filter 120.

Figure 5:
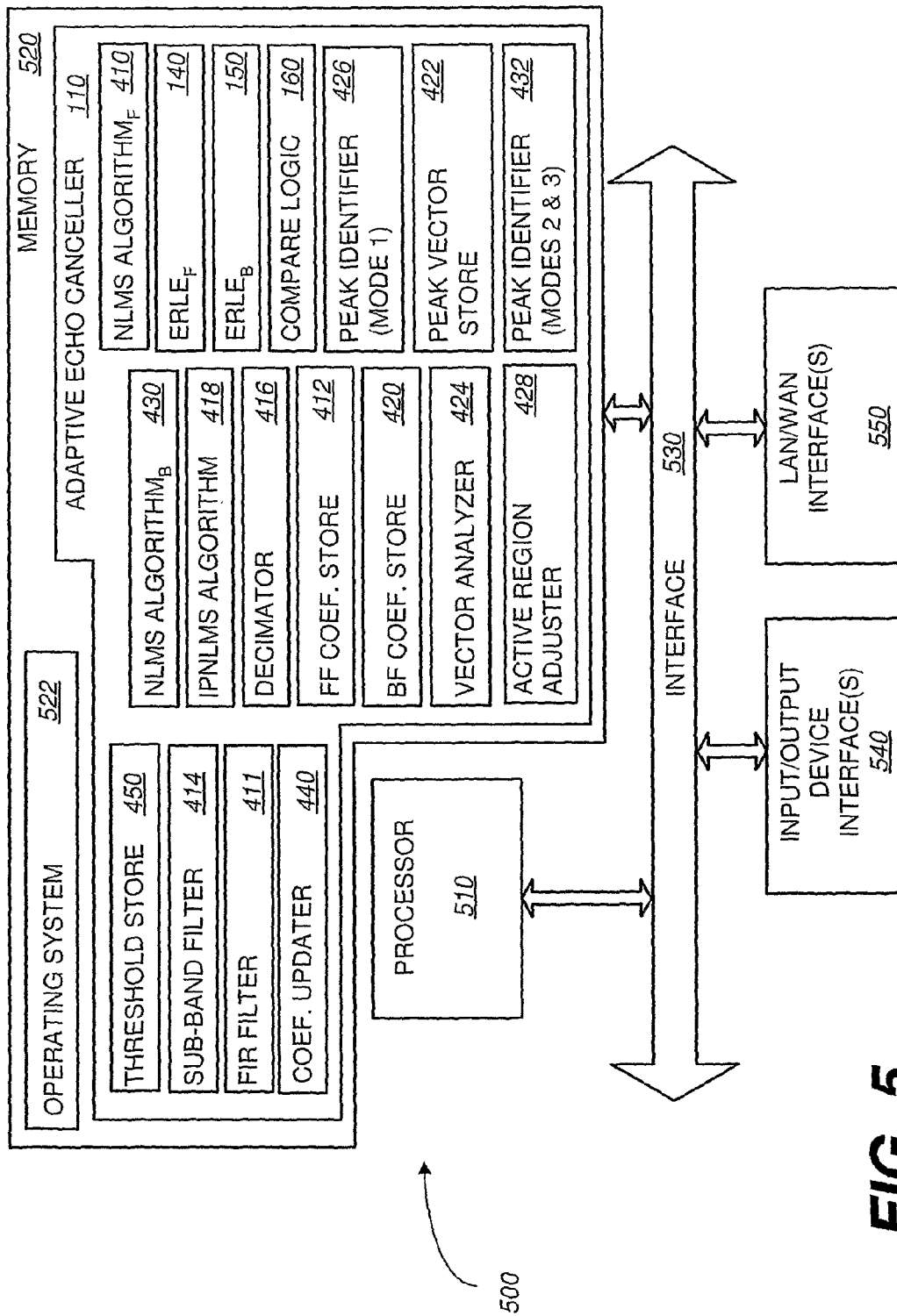
FIG. 5 is a functional block diagram illustrating an embodiment of a computing device configured to implement the adaptive echo canceller of FIG. 4.

FIG. 5 is a functional block diagram illustrating an embodiment of a computing device configured to implement the adaptive echo canceller 110 of FIGS. 2 and 4. Generally, in terms of hardware architecture, as shown in FIG. 5, the computing device 500 may include processor 510, memory 520, input/output device interface(s) 540, and LAN/WAN interface(s) 550 that are communicatively coupled via interface 530. Interface 530 can be, for example but is not limited to, one or more buses or other wired or wireless connections, as known in the art or that may be later developed. Interface 530 may have additional elements, which are omitted for simplicity, such as controllers, buffers (caches), drivers, repeaters, and receivers, to enable communications. Further, interface 530 may include address, control, and/or data connections to enable appropriate communications among the aforementioned components.

In the embodiment of FIG. 5, the processor 510 is a hardware device for executing software that can be stored in memory 520. The processor 510 can be any custom-made or commercially-available processor, a central processing unit (CPU) or an auxiliary processor among several processors associated with the computing device 500 and a semiconductor-based microprocessor (in the form of a microchip) or other executable instruction processors.

Memory 520 can include any one or combination of volatile memory elements (e.g., random access memory (RAM, such as dynamic RAM or DRAM, static RAM or SRAM, etc.)) and nonvolatile memory elements (e.g., read-only memory (ROM), hard drives, tape drives, compact discs (CD-ROM), etc.). Moreover, the memory 520 may incorporate electronic, magnetic, optical, and/or other types of storage media now known or later developed. Note that the memory 520 can have a distributed architecture, where various components are situated remote from one another, but accessible by processor 510.

The software in memory 520 may include one or more separate programs, each of which comprises an ordered listing of executable instructions for implementing logical functions. The embodiment illustrated in FIG. 5 shows each of the various functional modules of echo canceller 110 within memory 520. Those of ordinary skill in the art will understand that each of the various functional modules may be implemented in a separate computing device having a memory separate from memory 520. Memory 520 can be an integrated circuit device, an internal hard-disk drive, a magnetic tape drive, a compact-disk drive, and/or other data storage devices now known or later developed that can be made operable with processor 510. In some embodiments, software instructions and/or data associated with the echo canceller 110, such as coefficients, peak vectors, thresholds, and start and end points of one or more active regions may be distributed across several of the above-mentioned data storage devices.

In the example of FIG. 5, the software and data elements in memory 520 includes the various elements of echo canceller 110 that function and/or store information as a result of and in accordance with operating system 522. The operating system 522 preferably controls the execution of programs, such as the various functional components of echo canceller 110 and provides scheduling, input-output control, file and data management, memory management, and communication control and related services.

In the illustrated embodiment, the various functional modules of echo canceller 110 (i.e., $ERLE_F$ 140, $ERLE_B$ 150, compare logic 160, NLMS algorithm 410, FIR filter 411, sub-band filter 414, decimator 416, IPNLMS algorithm 418, vector analyzer 424, mode 1 peak identifier 426, active region adjuster 428, NLMS algorithm 430, mode 2 and 3 peak identifier 432, and coefficient updater 440) comprise one or more source programs, executable programs (object code), scripts, or other collections each comprising a set of instructions to be performed. It will be well-understood by one skilled in the art, after having become familiar with the teachings of the adaptive echo canceller 110, that each of its functional modules may be written in a number of programming languages now known or later developed.

The input/output device interface(s) 540 may take the form of human/machine device interfaces for communicating via various devices, such as but not limited to, a keyboard, a mouse or other suitable pointing device, a microphone, etc. LAN/WAN interface(s) 550 may include a host of devices that may establish one or more communication sessions between the computing device 500 and a network (not shown). LAN/WAN interface(s) 550 may include but are not limited to, a modulator/demodulator or modem (for accessing another device, system, or network); a radio frequency (RF) or other transceiver; a telephonic interface; a bridge; an optical interface; a router; etc. For simplicity of illustration and explanation, these aforementioned two-way communication devices are not shown.

When the computing device 500 is in operation, the processor 510 is configured to execute software stored within the memory 520, to communicate data such as filter coefficients in foreground filter coefficient store 412, background coefficient store 420, peak vectors in peak vector store 422, and a value in index threshold store 450 to and from the memory 520, and to generally control operations of the computing device 500 pursuant to the software. Each of the functional modules and the operating system 522, in whole or in part, but typically the latter, are read by the processor 510, perhaps buffered within the processor 510, and then executed.

Each of the functional modules illustrated within memory 520 can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this disclosure, a "computer-readable medium" can be any means that can store, communicate, propagate, or transport a program for use by or in connection with the instruction execution system, apparatus, or device. The computer-readable medium can be, for example but not limited to, an electronic, magnetic, optical, electromagnetic, infrared, or semiconductor system, apparatus, device, or propagation medium now known or later developed. Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

If implemented solely in hardware, as in an alternative embodiment, the echo canceller 110 can be implemented with any or a combination of technologies which are well-known in the art (e.g., discrete logic circuits, application specific integrated circuits (ASICs), programmable gate arrays (PGAs), field programmable gate arrays (FPGAs), etc.), or later developed technologies.

Figure 6:
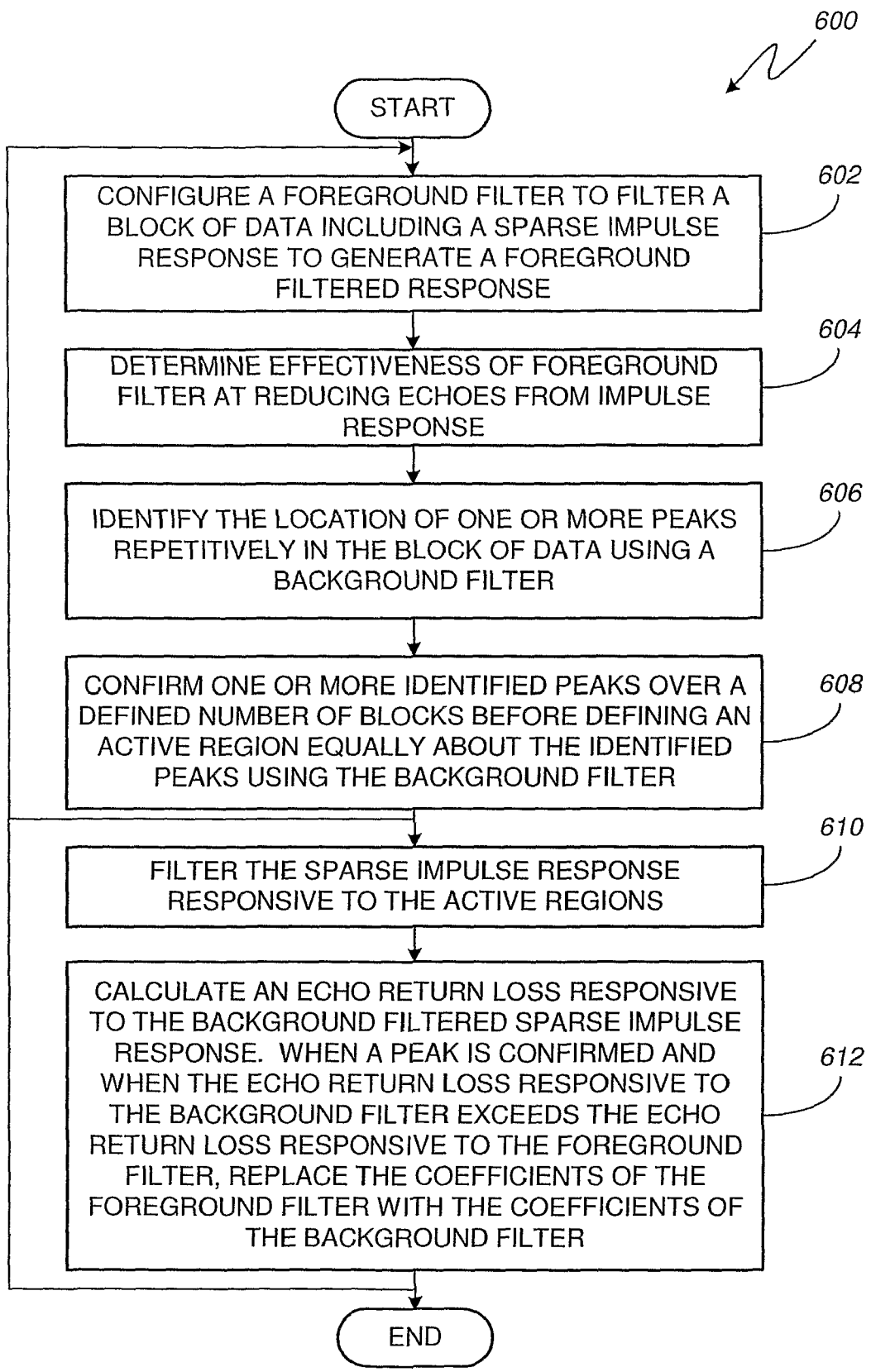
FIG. 6 is a flow diagram illustrating an embodiment of a method for adaptive echo cancellation.

FIG. 6 is a flow diagram illustrating an embodiment of a method 600 for adaptive echo cancellation. Adaptive echo cancellation 600 begins with block 602 where a foreground filter 120 is configured to process a block of data representing a sparse impulse response to generate a foreground filtered response. Next, in block 604 a measurement responsive to the effectiveness of the foreground filter 120 in reducing undesired echoes from the sparse impulse response is made. In block 606, a background filter 130 is used to repetitively identify one or more peaks in the sparse impulse response. In block 608, the background filter 130 confirms one or more identified peaks over a defined number of blocks of data before defining a respective active region equally about each of the identified peaks. When the background filter 130 fails to confirm at least one peak in the sparse impulse response, processing continues by repeating the functions of blocks 602 through 608.

In block 610, the background filter 130 is applied to the data responsive to the active regions. Thereafter, as illustrated in block 612, the background filter 130 determines the effectiveness of the background filter 130 in removing undesired echoes from the sparse impulse response. When one or more peaks are confirmed by the background filter 130 and the background filter 130 is more effective than the foreground filter 120 at reducing undesired echoes from the sparse impulse response, the coefficients of the background filter 130 are forwarded to the foreground filter 120. As indicated by the flow control arrow adaptive echo cancellation 600 continues thereafter by repeating the functions of blocks 602 through 612 as may be desired for the duration of the communication session.

Figure 7A:
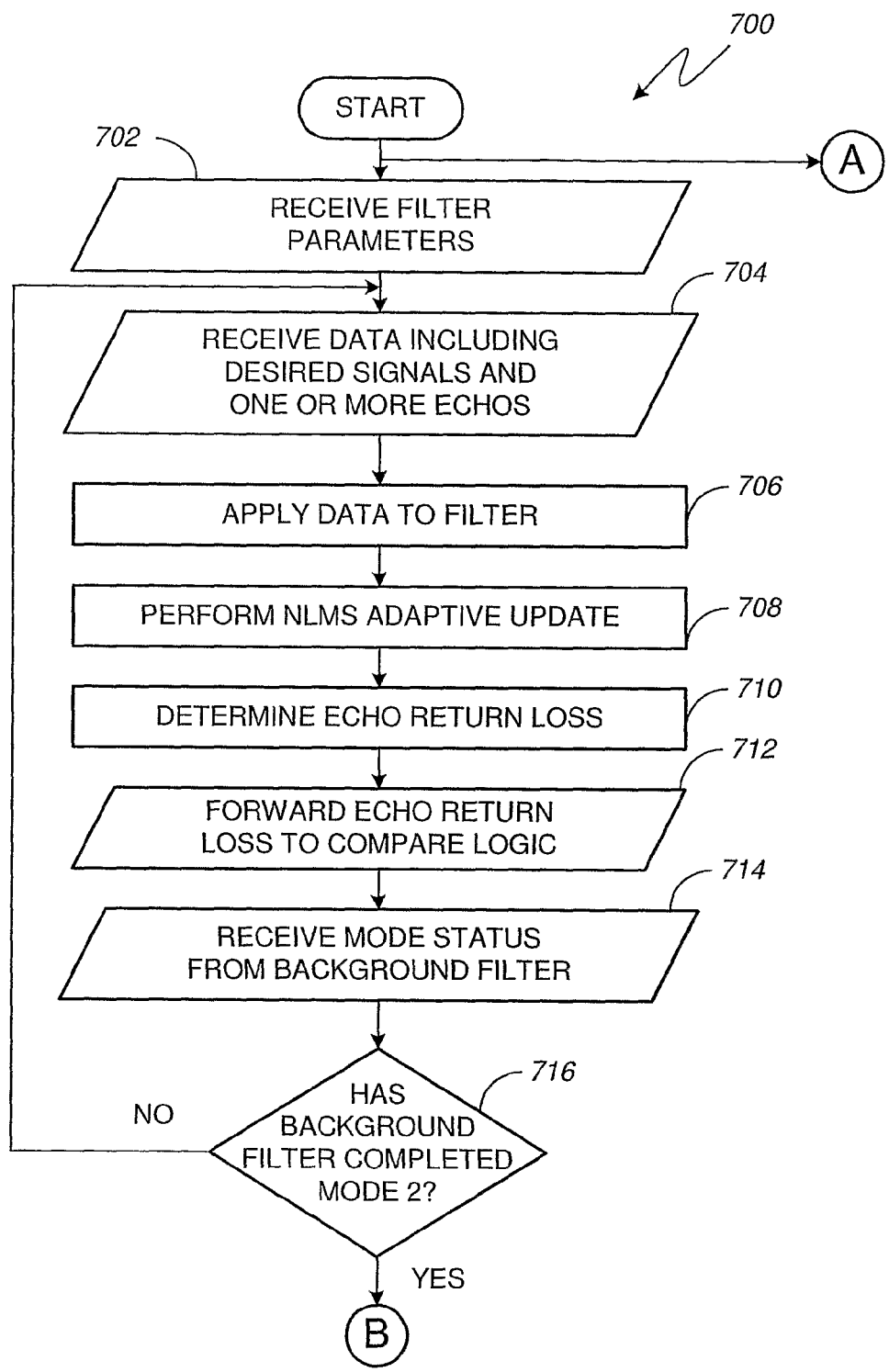
Figure 7B:
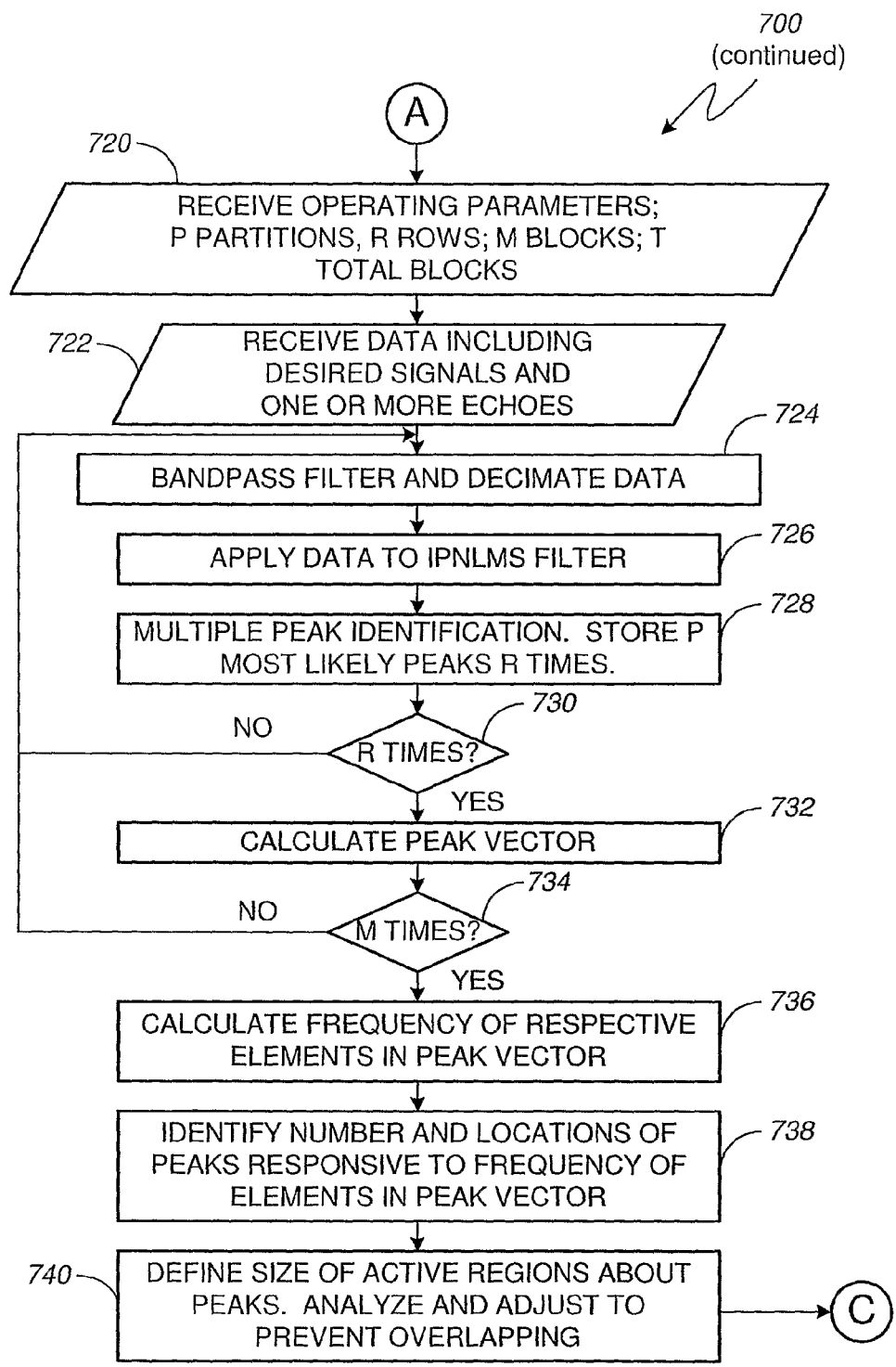

FIGS. 7A-7E are flow diagrams illustrating portions of an embodiment of a method for adaptive echo cancellation 700. Specifically, FIG. 7A illustrates operation of a foreground filter 120 when in an adaptive mode. Adaptive echo cancellation 700 begins with input/output block 702 where default filter parameters are received. As indicated by the flow control arrow coupled to connector A and as illustrated in FIG. 7B, background-filter mode 1 operation begins substantially simultaneously with operation of the foreground filter 120.

Next, as indicated in input/output block 704 input data signals are received. The input data signals, including desired information and one or more echoes, are applied to a filter as indicated in block 706. In block 708 a NLMS adaptive update of the filter coefficients is performed. In block 710, the effectiveness of the foreground filter 120 in reducing the undesired echoes from the data signal is determined. A result of the determination in block 710 is forwarded to a register, or some other data storage element, as shown in input/output block 712. Thereafter, a mode status identifier is received from background filter 130 as shown in input/output block 714. As further illustrated in FIG. 7A, when the mode status identifier indicates that the background filter 130 has completed mode 2, the foreground filter 120 transitions via connector B to a fixed mode of operation as illustrated in FIG. 7E. Otherwise, foreground filter 120 remains in adaptive mode and as indicated by the flow control arrow labeled "NO," exiting decision block 716, the functions associated with blocks 704 through 716 are repeated.

FIG. 7B is a flow diagram illustrating an embodiment of a first operational mode of background filter 130. Adaptive echo cancellation 700 continues from connector A (i.e., from the start of foreground filter 120 operating in adaptive mode) with input output block 720 where background filter 130 receives operating parameters used in identifying one or more peaks in a sparse impulse response. Next, as indicated in input/output block 722, data including desired signals and one or more undesired echoes is received. Thereafter, as shown in block 724, the data is sub-band filtered and decimated. The sub-band filtered and decimated data is applied to an IPNLMS algorithm in block 726. The filtered result of the IPNLMS algorithm of block 726 is forwarded to multiple peak identification logic that stores results indicative of a specified number of most likely peaks across a specified number of partitions, a specified number of times, as indicated in block 728. Decision block 730 queries a counter and returns an affirmative result once R rows of sampled data have been captured. Otherwise, the functions of blocks 724 through 730 are repeated. Once a result array has been populated, a peak vector is identified and stored as shown in block 732. Decision block 734 queries a counter and returns an affirmative result once M blocks of sampled data have been captured. Otherwise, the functions of blocks 724 through 734 are repeated. In block 736, a frequency of occurrence analysis is performed on a columnar basis over respective elements in the peak vector. Thereafter, in block 738, background filter 130 identifies the number of peaks and their respective locations in time responsive to the peak vector of block 732. Lastly, the first operational mode for the background filter 130 defines the size of active regions about the identified peaks, as indicated in block 740. Defining active regions includes strategically placing the respective active regions in time and adjusting the placement of the active regions as may be required to prevent overlapping. As further indicated in the flow diagram of FIG. 7B, adaptive echo cancellation continues via connector C.

Figure 7C:
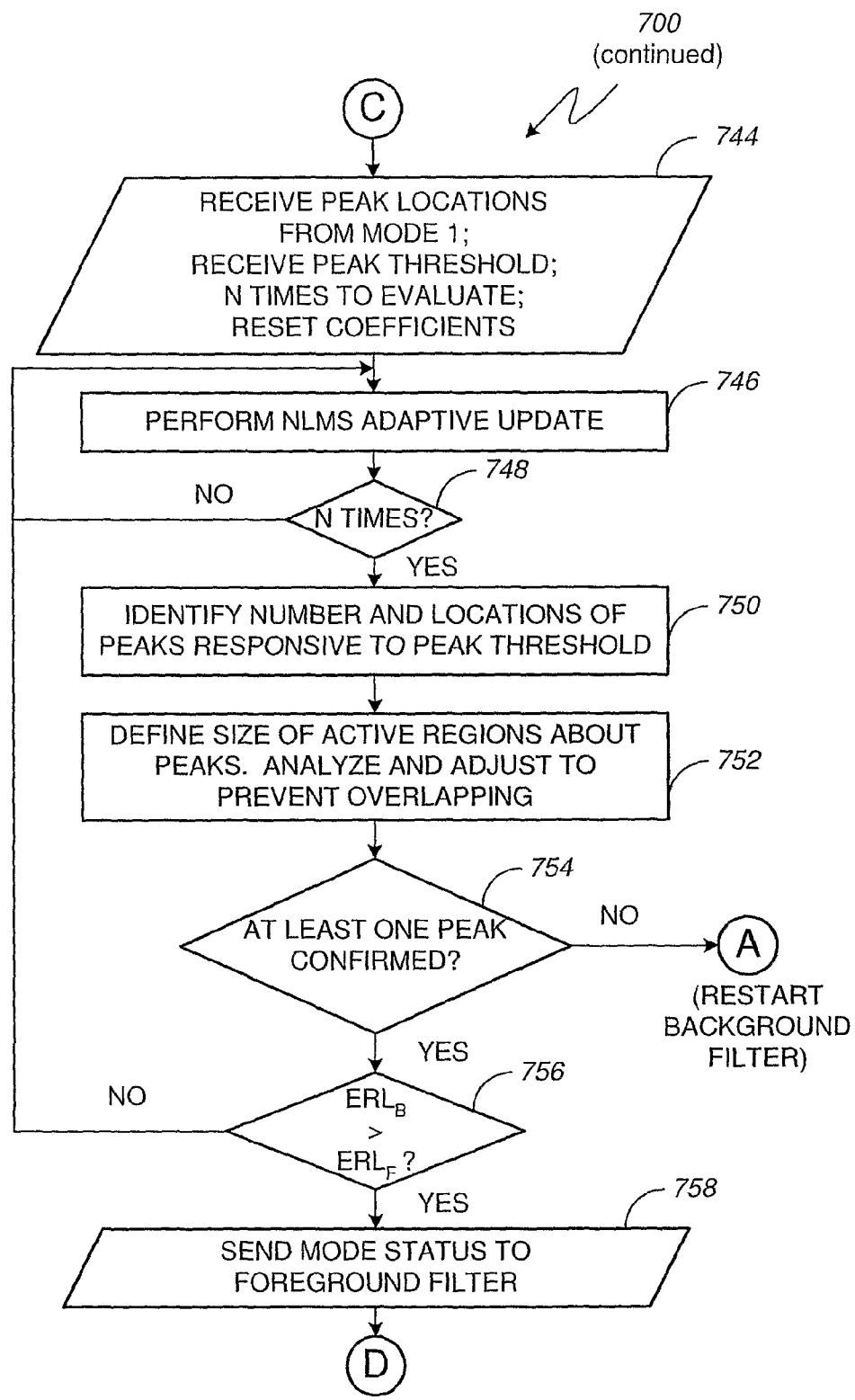
Figure 7E:
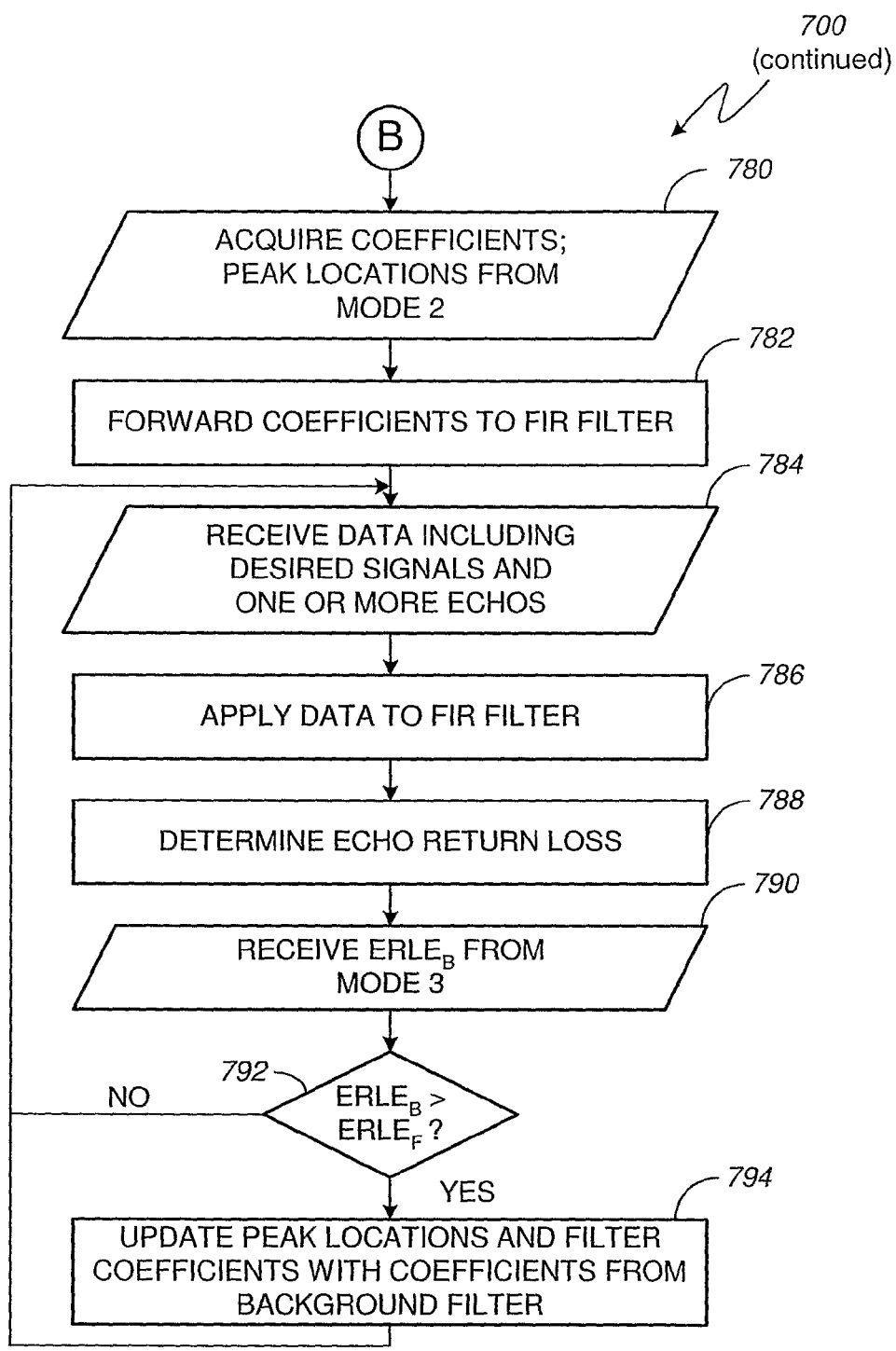

FIG. 7C is a flow diagram illustrating an embodiment of a second operational mode of background filter 130. Adaptive echo cancellation 700 continues with input output block 744 from connector C where background filter coefficients are reset and operating parameters received for use in confirming the one or more peaks identified in mode 1 in a sparse impulse response. Next, as indicated in block 746, a NLMS adaptive update is performed to on the sparse impulse response. Decision block 748 queries a counter and returns an affirmative result once the NLMS adaptive update has been performed N times. Thereafter, as shown in block 750, the filtered result of the NLMS algorithm of block 746 is forwarded to multiple peak identification logic that locates and identifies peaks responsive to a peak threshold. The second operational mode for the background filter 130 defines the size of active regions about the identified peaks, as indicated in block 752. Defining active regions includes strategically placing the respective active regions in time and adjusting the placement of the active regions as may be required to prevent overlapping. Thereafter, a comparison is made to determine if at least one peak identified in mode 1 has been confirmed during the mode 2 processing as shown in decision block 754. When no peaks have been confirmed, as indicated by the flow control arrow labeled "NO," exiting decision block 754 the background filter is reset and returns to mode 1 operation as previously described in association with the flow diagram of FIG. 7B. Otherwise, when at least one peak identified in mode 1 is confirmed during the mode 2 processing, a second query is performed as indicated in decision block 756 to determine if the background filter 130 is more effective than the foreground filter 120 at reducing echo induced peaks from the sparse impulse response. When the background filter 130 is less effective than the foreground filter 120, as indicated by the flow control arrow labeled "NO," exiting decision block 750, mode 2 processing continues with the functions of blocks 746 through 756. Otherwise, when the background filter 130 is more effective than the foreground filter 120, as indicated by the flow control arrow labeled "YES," exiting decision block 756, the background filter mode is forwarded to the foreground filter as indicated in input/output block 758. Adaptive echo cancellation 700 continues via connector D with mode 3 background filter operation as illustrated in FIG. 7D.

FIG. 7D is a flow diagram illustrating an embodiment of a third operational mode for the background filter 130. Adaptive echo cancellation 700 continues with input output block 760 where an operating parameter is received to define the number of times the background filter will evaluate the data signal. Background filter coefficients from mode 2 operation are reused in the NLMS adaptive update process of block 762. A determination of the echo return loss enhancement for the background filter 130 is performed as indicated in block 764. Decision block 766 queries a counter and returns an affirmative result once the NLMS adaptive update has been performed J times. Otherwise, the functions of blocks 762 through 766 are repeated. Adaptive echo cancellation 700 continues by identifying the number and location of peaks responsive to a peak threshold, as shown in block 768. Next, a query is performed to determine if at least one peak exceeds the peak threshold, as indicated in decision block 770. If no peak is confirmed that exceeds the peak threshold, as indicated by the flow control arrow labeled, "NO" adaptive echo cancellation returns to restart the foreground filter as shown by connector A. Otherwise, when a peak is confirmed that exceeds the threshold value as indicated by the flow control arrow labeled, "YES" exiting decision block 770, the third operational mode for the background filter 130 defines the size of active regions about the identified peaks, as indicated in block 772. Defining active regions includes strategically placing the respective active regions in time and adjusting the placement of the active regions as may be required to prevent overlapping. Thereafter, as shown in input/output block 774 a measure of the effectiveness of the background filter 130 at reducing undesired echoes in the sparse impulse response is forwarded to the foreground filter 120. Thereafter, the background filter 130 updates the FIR filter coefficients in the foreground filter coefficient store 412, as indicated in block 776 and the functions of blocks 762 through 776 are repeated as indicated by the flow control arrow exiting block 776.

FIG. 7E illustrates operation of a foreground filter 120 when in a fixed mode. Adaptive echo cancellation 700 continues with input/output block 780 where filter coefficients and peak locations identified during mode 2 operation of the background filter 130 are received in foreground filter 120. Next, as indicated in block 782 the coefficients are forwarded to FIR filter 411. Thereafter, as indicated in input/output block 784, input data signals are received. The input data signals including desired information and one or more echoes are applied to the FIR filter as indicated in block 786. In block 788, the effectiveness of the foreground filter 120 in reducing the undesired echoes from the data signal is determined. In input/output block 790, the foreground filter 120 receives a measure of the effectiveness of the background filter 130 at reducing undesired echoes from the data signal. Next, as indicated in decision block 792, a determination is made whether the background filter 130 is more effective than the foreground filter 120. When foreground filter 120 is more effective, as indicated by the flow control arrow labeled "NO," exiting decision block 792, the foreground filter 120 remains in fixed mode and uses the coefficients developed in previous iterations of the background filter. Accordingly, functions associated with blocks 784 through 792 are repeated. Otherwise, when the background filter 130 is more effective than the foreground filter 120 as indicated by the flow control arrow labeled, "YES," exiting decision block 792, the coefficients of the foreground filter 120 are replaced with the coefficients of the background filter 130 as indicated in block 794. As further illustrated in FIG. 7E, adaptive echo cancellation 700 continues as desired for the remainder of the communication session with the foreground filter 120 operating in the above described fixed mode of operation.

Any process descriptions or blocks in the flow diagrams presented in FIGS. 3, 6, and 7A-7E should be understood to represent modules, segments, or portions of code or logic, which include one or more executable instructions for implementing specific functions or steps in the associated process. Alternate implementations are included within the scope of the present system in which functions may be executed out of order from that shown or discussed, including substantially concurrently or in reverse order, depending on the functionality involved, as would be understood by those reasonably skilled in the art after having become familiar with the teachings of the present systems and methods for adaptive echo cancellation.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill to utilize various embodiments of the adaptive echo canceller. All such modifications and variations are within the scope of the appended claims when interpreted in accordance with the breadth to which they are fairly and legally entitled.

What is claimed is:

1. A method for adaptive echo cancellation, comprising:
configuring an adaptive foreground filter to apply to a block of data including a sparse impulse response to generate a foreground filtered response;
calculating an echo return loss responsive to the foreground filtered response;
identifying the location of one or more peaks repetitively in the block of data in a background filter;
confirming one or more identified peaks over a defined number of blocks before defining an active region equally about the identified peaks in the background filter;
filtering the sparse impulse response responsive to at least one active region,
calculating an echo return loss responsive to the background filtered sparse impulse response;
comparing the second echo return loss responsive to the background filter with the first echo return loss responsive to the foreground filter; and
when a peak is confirmed and when the second echo return loss exceeds the first echo return loss, replacing coefficients from the adaptive foreground filter by the coefficients from the background filter to create a modified foreground filter.

2. The method of claim 1, wherein identifying the location of one or more peaks repetitively is responsive to a sub-band filtered and decimated signal.

3. The method of claim 1, wherein confirming one or more identified peaks over a defined number of blocks comprises applying a modified improved proportionate normalized least-mean square (IPNLMS) algorithm.

4. The method of claim 3, wherein the modified IPNLMS algorithm comprises populating an array of sampled peak values.

5. The method of claim 3, wherein the modified IPNLMS algorithm comprises calculating a peak vector.

6. The method of claim 5, wherein the modified IPNLMS algorithm comprises calculating the frequency of stored indices in the peak vector.

7. The method of claim 1, wherein defining an active region equally about identified peaks comprises analyzing and adjusting the width of each respective active region to prevent overlapping active regions.

8. An adaptive echo canceller embodied in a non-transitory computer-readable medium that when executed by one or more processors filters sampled data, the adaptive echo canceller, comprising:
  a foreground filter configured with coefficients expected to remove echo induced peaks in a sparse impulse response and calculate a first echo return loss value; and
  a background filter configured to:
    bandpass filter and decimate the sparse impulse response;
    repetitively identify the location of one or more peaks in the sparse impulse response;
    confirm one or more identified peaks over a defined number of blocks of the sparse impulse response before defining an active region equally about the one or more identified peaks such that when a peak is confirmed an adaptive normalized least-mean square algorithm is applied to filter the sparse impulse response; and
    calculate a second echo return loss value responsive to the filtered sparse impulse response and
  when a peak is confirmed and when the first and second echo return losses are compared, and when the second echo return loss value exceeds the first echo return loss value, coefficients in the foreground filter are replaced with one or more coefficients from the background filter to modify the foreground filter.

9. The adaptive echo canceller of claim 8, wherein the background filter confirms one or more identified peaks by applying a modified improved proportionate normalized least-mean square (IPNLMS) algorithm.

10. The adaptive echo canceller of claim 9, wherein the modified IPNLMS algorithm comprises populating an array of sampled peak values.

11. The adaptive echo canceller of claim 9, wherein the modified IPNLMS algorithm comprises calculating a peak vector.

12. The adaptive echo canceller of claim 11, wherein the modified IPNLMS algorithm comprises determining the frequency with which indices are above a threshold value in the peak vector.

13. The adaptive echo canceller of claim 8, wherein the background filter defines an active region equally about identified peaks by analyzing and adjusting the width of each respective active region to prevent overlapping active regions.

14. The adaptive echo canceller of claim 8, wherein the foreground filter is configured to operate in one of an adaptive mode and a fixed mode and applied to the sampled signal, the background filter is configured to operate in one of first, second, and third operational modes.

15. An adaptive echo canceller, comprising:
  means for determining the effectiveness of a foreground filter at removing one or more echo induced peaks in a sparse impulse response;
  means for repetitively identifying the location of a user defined number of peaks responsive to a bandpass filtered and decimated representation of the sparse impulse response;
  means for storing a user defined number of peak detection vectors responsive to peaks in the representation of the sparse impulse response;
  means for confirming the location of a peak responsive to the frequency of a respective element within the peak detection vectors; means for defining one or more active regions centered about respective confirmed peaks;
  means for background filtering the representation of the sparse impulse response responsive to the one or more active regions;
  means for determining the effectiveness of the means for background filtering at removing peaks in the representation of the sparse impulse response; and
  means for comparing the effectiveness of the foreground filter to the effectiveness of the means for background filtering, wherein when the means for background filtering is more effective than the foreground filter, one or more coefficients in the foreground filter are replaced with coefficients associated with the means for background filtering to create an improved foreground filter.

16. The adaptive echo canceller of claim 15, wherein the means for confirming the location of a peak comprises a modified improved proportionate normalized least-mean square (IPNLMS) algorithm.

17. The adaptive echo canceller of claim 16, wherein the modified IPNLMS algorithm comprises populating an array responsive to sampled peak values.

18. The adaptive echo canceller of claim 16, wherein the modified IPNLMS algorithm comprises calculating a peak vector.

19. The adaptive echo canceller of claim 18, wherein the modified IPNLMS algorithm comprises determining the frequency with which indices are above a threshold value in the peak vector.

20. The adaptive echo canceller of claim 15, wherein the means for defining active regions adjusts the width of each respective active region to prevent overlapping between adjacent active regions.

* * * * *